United States Patent

Nakagawa et al.

[11] Patent Number: 5,632,813
[45] Date of Patent: May 27, 1997

[54] ELECTRODE FORMING APPARATUS FOR CHIP TYPE ELECTRONIC COMPONENTS

[75] Inventors: Tadahiro Nakagawa; Shizuma Tazuke; Satoshi Omuro; Kiyoshi Yoshida; Nobuaki Kashiwagi; Takashi Kimoto, all of Kyoto, Japan

[73] Assignee: Murata Manufacturing Co., Ltd., Japan

[21] Appl. No.: 840,838

[22] Filed: Feb. 25, 1992

[30] Foreign Application Priority Data

Nov. 8, 1991 [JP] Japan ................... 3-321333

[51] Int. Cl.6 ................................................. B05C 13/00
[52] U.S. Cl. ............................................ 118/58; 118/66
[58] Field of Search .......................... 118/641, 642, 118/58, 423, 407, 66; 427/430.1, 372.2; 414/937, 940; 34/190, 189, 318, 321; 198/952, 478.1, 404

[56] References Cited

U.S. PATENT DOCUMENTS

| | | | |
|---|---|---|---|
| 4,141,458 | 2/1979 | Brooks et al. | 414/937 |
| 4,282,825 | 8/1981 | Nagatomo et al. | 118/58 |
| 4,315,705 | 2/1982 | Flint | 118/52 |
| 4,395,184 | 7/1983 | Braden | 414/417 |
| 4,664,943 | 5/1987 | Nitta et al. | |
| 4,761,894 | 8/1988 | Hamasaki et al. | 118/58 |
| 4,788,391 | 11/1988 | Nitta et al. | |
| 4,859,498 | 8/1989 | Yamaguchi | |
| 4,900,212 | 2/1990 | Mikahara | 414/937 |
| 4,926,789 | 5/1990 | Wenger | 118/58 |
| 5,061,529 | 10/1991 | Ruehl | 118/58 |
| 5,120,577 | 6/1992 | Yamaguchi et al. | 427/282 |

FOREIGN PATENT DOCUMENTS

| | | | |
|---|---|---|---|
| 3839891 | 6/1989 | Germany. | |
| 61-254403 | 11/1986 | Japan | 198/347.1 |
| 344404 | 7/1991 | Japan. | |

*Primary Examiner*—Brenda A. Lamb
*Attorney, Agent, or Firm*—Ostrolenk, Faber, Gerb & Soffen, LLP

[57] ABSTRACT

A dipping machine has a chucking portion for engaging a holding plate to downwardly direct chip components, which are held by the holding plate, and a dipping vessel provided under the chucking portion, which is coated with a thin film of electrode paste. Conveyors horizontally transfer the holding plate holding the downwardly directed chip components, coated with the electrode paste, to a drying furnace. The drying furnace receives the holding plate holding the chip components downwardly and rotates the same by 360° for drying the electrode paste. Thus, the as-formed electrodes have uniform widths on side surfaces of the chip components and the electrode paste is protected against adhesion of foreign matters such as dust, whereby it is possible to manufacture chip components with stable quality.

32 Claims, 4 Drawing Sheets

ELECTRODE FORMING APPARATUS FOR CHIP TYPE ELECTRONIC COMPONENTS

BACKGROUND OF THE INVENTION

1. Field of the Invention

The present invention relates to an apparatus for forming external electrodes on end portions of chip type electronic components, such as chip capacitors or chip resistors.

2. Description of the Background Art

In order to simultaneously apply electrodes onto end portions of a number of chip type electronic components, a holding plate is generally employed for elastically holding the chip components, as disclosed in U.S. Pat. No. 4,395,184. This holding plate comprises a hard substrate, a thin flat plate portion which is formed at a central portion of the substrate and provided with a number of through holes, and a rubber-like elastic member which is embedded in a concave portion defined in the flat plate portion, the elastic member being provided with receiving holes, passing through the elastic member, in portions corresponding to the through holes.

In order to form external electrodes on end portions of chip components, the holding plate first receives the chip components in the receiving holes with parts of the components projecting upward. Then the holding plate is placed on and carried by a conveyor to pass through a roll which is coated with electrode paste, so that the electrode paste is applied to the projected portions of the chip components. Thereafter the holding plate is carried by the conveyor to a position under heating means for heating and drying the electrode paste.

In this case, however, the chip components whose upper end portions are coated with the electrode paste are directly carried toward the heating means, and hence the electrode paste disadvantageously flows down on the side surfaces of the chip components during such carriage. Therefore, electrode widths due to the flow on the side surfaces of the chip components are irregular, and shorts may occur across the external electrodes. If the chip components are 1.6 mm in length, for example, the electrode widths must be controlled to about 0.15 mm. When the undried chip components are carried in the upwardly directed state, foreign matter, such as dust, easily adheres to the electrode surfaces, and it is impossible to remove such foreign matter.

SUMMARY OF THE INVENTION

Accordingly, an object of the present invention is to provide an electrode forming apparatus for chip components, which can form electrodes with uniform electrode widths on the side surfaces of the chip components, while protecting electrode paste against adhesion of foreign matter such as dust, for manufacturing chip components of stable quality.

In order to attain the aforementioned object, an aspect of the present invention is directed to an apparatus for forming external electrodes on projected portions of chip components which are received in receiving holes of a holding plate to be partially projected from the receiving holes. An embodiment of the inventive apparatus comprises a dipping machine, a drying furnace and conveyor means for carrying the holding plate from the dipping machine to the drying furnace. The dipping machine is provided with a dipping vessel having a horizontal bottom surface which is coated with a thin film of electrode paste and a chucking portion which is provided above the dipping vessel for horizontally engaging the holding plate to downwardly direct the chip components and vertically moving the same for coating the projected portions of the chip components with the electrode paste. The conveyor means horizontally carries the holding plate to the drying furnace while downwardly directing the surfaces of the chip components coated with electrodes. The drying furnace receives the holding plate, downwardly holding the chip components, for continuously heating and drying the electrode surfaces of the chip components. Preferably the drying furnace comprises a rotor which is intermittently rotated while supporting a plurality of holding plates, means for heating and drying electrode surfaces of chip components held by the holding plates which are supported by the rotor, means for introducing the holding plates one by one into the rotor, and means for extracting the dried holding plates one by one from the rotor.

According to another aspect of the present invention, the holding plate first receives the chip components in the receiving holes to partially downwardly project the same, and is then set in the dipping machine. The dipping machine horizontally engages the holding plate with the chucking portion. The dipping vessel, whose bottom surface is coated with a thin film of electrode paste, is set under the chucking portion. The chucking portion is downwardly moved to bring the downwardly projected portions of the chip components into contact with the bottom surface of the dipping vessel. Then the chucking portion is upwardly moved, so that the projected portions of the chip components are coated with the electrode paste with constant thicknesses. The holding plate engaged by the chucking portion is transferred to the conveyor means and carried into the drying furnace. The drying furnace receives the holding plate holding the chip components, having downwardly directed electrode surfaces, for continuously heating and drying the same. Thus, the electrode surfaces can be efficiently dried with no long waiting time, unlike batch processing. The chip components are then carried from the dipping vessel to the drying furnace while downwardly directing the electrode surfaces, whereby the electrode paste will not flow down the side surfaces of the chip components to make the electrode widths irregular. Further, the downwardly directed electrode surfaces are protected against adhesion of foreign matter such as dust.

As hereinabove described, the drying furnace preferably comprises an intermittently rotated rotor, which can support a plurality of holding plates. This rotor is stopped when the holding plates are introduced into the same one by one by introduction means. After the holding plates are introduced, the rotor is rotated at a constant pitch, to dry the electrode surfaces of the chip components held by the holding plates passing through heating zones of a prescribed temperature. After the electrode surfaces are completely dried, the holding plates are extracted by the extraction means.

The conveyor means employed in the present invention can be arbitrarily formed by means comprising a carriage table which is mounted on a nut member engaged with a ball screw for receiving the holding plate on the carriage table and carrying the same, means for receiving both side portions of the holding plate on a pair of carriage belts and carrying the same, or the like.

According to a further aspect of the present invention, the electrode surfaces are downwardly directed when the chip components are carried from the dipping vessel to the drying furnace, so that the electrode paste does not drip. Thus, it is possible to obtain chip components having uniform electrode widths. Further, the electrode paste is protected against adhesion of foreign matter such as dust, since the electrode surfaces are downwardly directed.

In addition, it is not necessary to invert the holding plate for carrying the same to the drying furnace after dipping, whereby workability is improved and no vibration is applied to the holding plate, so that the chip components are neither inclined nor dropped.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
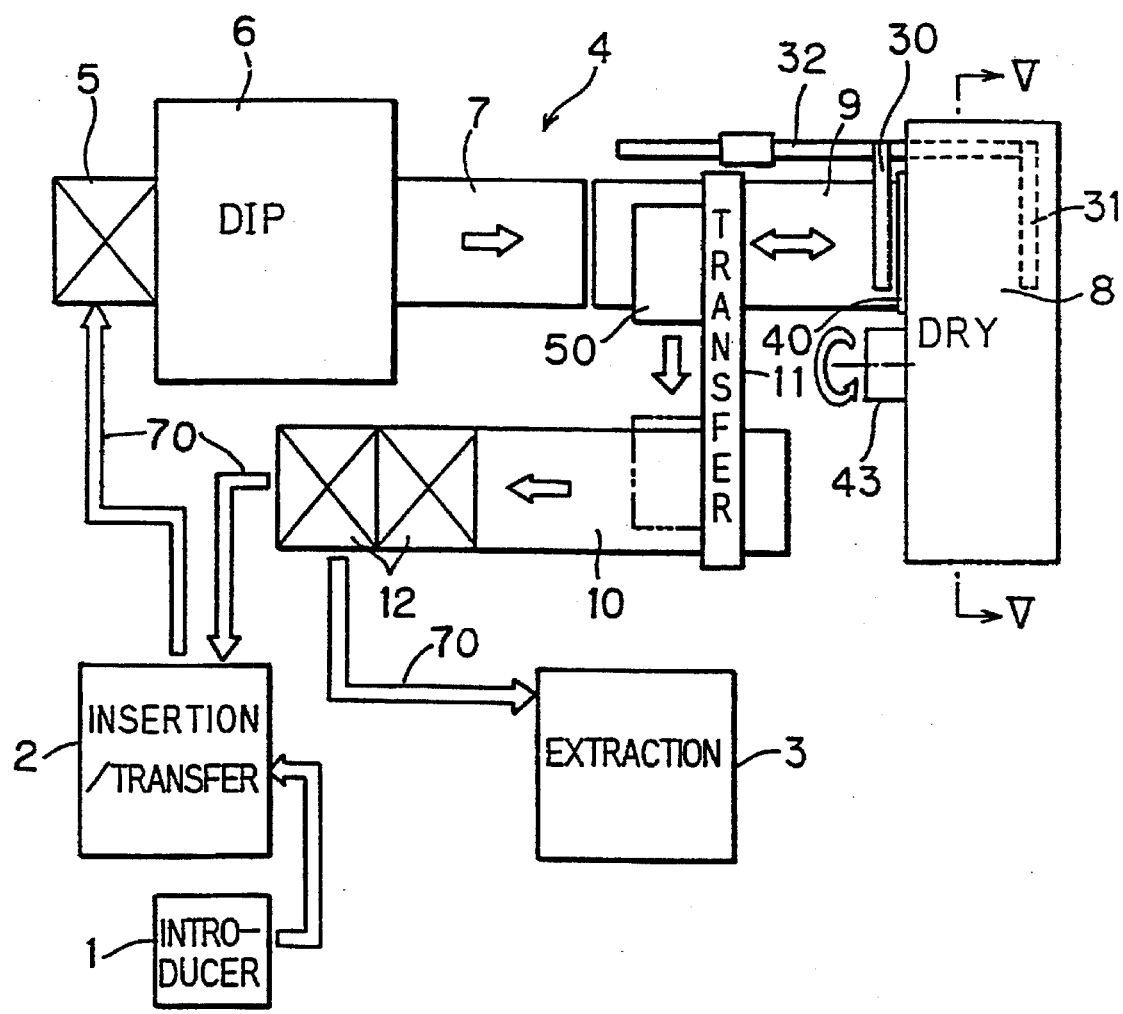
FIG. 1 is a plan view schematically showing an electrode forming apparatus according to an embodiment of the present invention.

FIG. 1 is a general view showing an apparatus for manufacturing chip components, which is formed by an introducer 1, an insertion/transfer press 2, an extraction press 3, and an electrode forming apparatus 4, according to an embodiment of the present invention.

The introducer 1, which is adapted to bring chip components B into contact with upper surfaces of receiving holes $a_1$ being provided in a holding plate A (see FIG. 2), sets a guide plate (not shown), having through holes corresponding to the receiving holes $a_1$, on the holding plate A. Then the introducer 1 places a number of chip components B on the guide plate at random, and downwardly vacuum-sucks the same with vibration, thereby introducing the chip components B one by one into the through holes of the guide plate. U.S. Pat. No. 4,395,184 discloses an example of such an introducer 1.

The insertion/transfer press 2 receives the guide plate receiving the chip components B in the through holes and the holding plate A in an overlapped manner, and pushes the chip components B from the through holes into the receiving holes $a_1$ with press pins. At this time, the chip components B are partially upwardly projected from the receiving holes $a_1$. Then the electrode forming apparatus 4 forms electrodes on the projected portions of the chip components B, and the insertion/transfer press 2 transfers the chip components B from the holding plate A to another holding plate A. This operation of the insertion/transfer press 2 is described in U.S. Pat. No. 4,664,943, for example.

Thereafter the electrode forming apparatus 4 forms electrodes on other end portions of the chip components B, and the extraction press 3 which is similar in structure to the insertion/transfer press 2 extracts the chip components B from the holding plate A, to complete the series of steps.

The holding plate A may be manually carried from the introducer 1 to the insertion/transfer press 2, from the insertion/transfer press 2 to the electrode forming apparatus 4, from the electrode forming apparatus 4 to the insertion/transfer press 2, and from the electrode forming apparatus 4 to the extraction press 3, or transferred with a robot. Alternatively, carriage means such as conveyors 70 may be provided between these apparatuses.

The electrode forming apparatus 4 comprises a loader 5 for storing a plurality of holding plates A which are received from the insertion/transfer press 2 to downwardly direct the projected portions of the chip components B, a dipping machine 6 for receiving the holding plates A one by one from the loader 5 and performing prescribed dipping, a conveyor 7 for discharging the dipped holding plates A one by one from the dipping machine 6, a drying furnace 8 for heating and drying electrode surfaces of the chip components B being held by the holding plates A, a reversibly drivable introduction/extraction conveyor 9 for transferring the holding plates A from the conveyor 7 to the drying furnace 8, a transfer conveyor 11 for transferring the dried holding plates A from the introduction/extraction conveyor 9 to another conveyor 10, and two unloaders 12 for temporarily storing the holding plates A carried on the conveyor 10.

Figure 2:
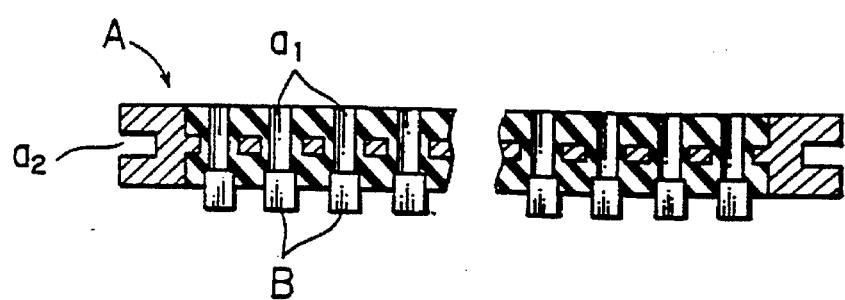
FIG. 2 is a sectional view of an exemplary holding plate which is employed in the electrode forming apparatus shown in FIG. 1.
Figure 3:
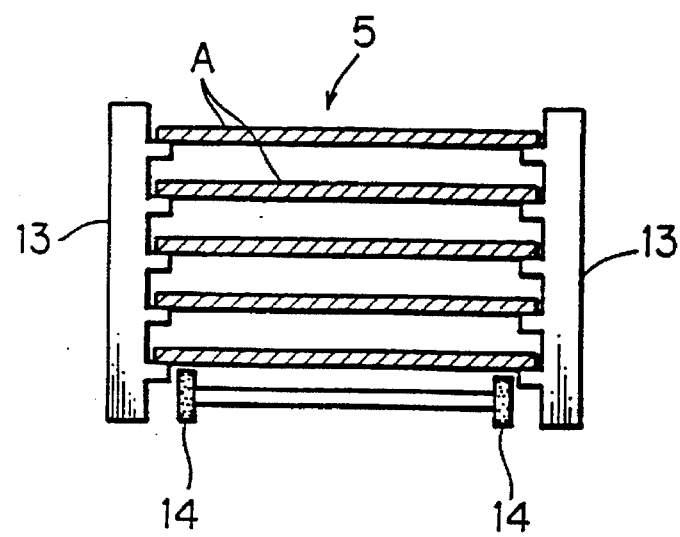
FIG. 3 is a side elevational view of a loader which is included in the electrode forming apparatus shown in FIG. 1.

As shown in FIG. 3, the loader 5 comprises a pair of rack frames 13 for vertically movably supporting a plurality of holding plates A in a parallel manner, and a conveyor 14 which is horizontally arranged between the rack frames 13. As shown in FIG. 2, each holding plate A holds a number of chip components B to partially downwardly project the same. The rack frames 13 are moved down stepwise to place the holding plates A one by one on the conveyor 14. The conveyor 14 carries the holding plates A to the dipping machine 6, which is located in a direction perpendicular to the plane of FIG. 3.

Figure 4:
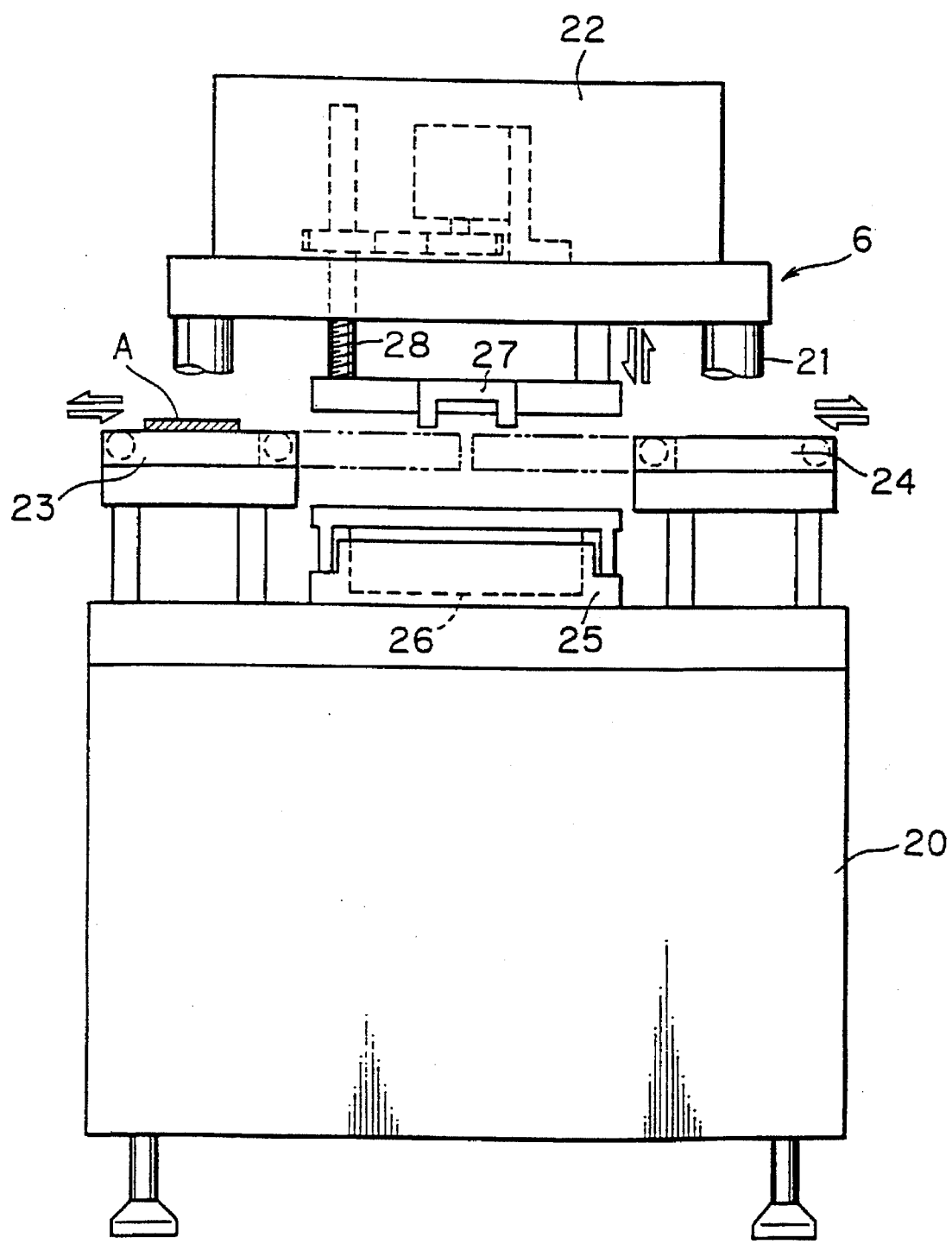
FIG. 4 is a front elevational view of a dipping machine which is included in the electrode forming apparatus shown in FIG. 1.

As shown in FIG. 4, the dipping machine 6 is formed by a dip head driving portion 22 which is fixed to a dipping machine body 20 through supports 21, a supply conveyor 23, a discharge conveyor 24, a dipping vessel 25, and a blade portion 26. In the dip head driving portion 22, a chucking portion 27 for chucking both sides of each holding plate A is vertically movably supported by a vertical shaft 28. The supply conveyor 23 and the discharge conveyor 24, which are adapted to rightwardly carry each holding plate A in FIG. 4, are movable to such positions that upper portions thereof approach each other, as shown by two-dot chain lines in FIG. 4. After the conveyors 23 and 24 are moved to such positions, the holding plate A is carried to a position across the conveyors 23 and 24. Then the chucking portion 27 is downwardly moved to easily engage the holding plate A, which is located across the conveyors 23 and 24. Thereafter the conveyors 23 and 24 are moved back to the positions shown by solid lines, and the chucking portion 27 holding the holding plate A is moved down into the dipping vessel 25, for prescribed dipping. The holding plate A may be provided with grooves $a_2$ (see FIG. 2) on shorter edges thereof for receiving forward end portions of the chucking portion 27, so that the chucking portion 27 will not hinder the dipping operation but electrodes can be uniformly applied to the chip components B.

The bottom surface of the dipping vessel 25 is in the form of a horizontal container, and the blade portion 26 is movable across the dipping vessel 25 perpendicular to the plane of FIG. 4. A small clearance is defined between the lower edge of the blade portion 26 and the bottom surface of the dipping vessel 25, so that electrode paste is applied onto the bottom surface of the dipping vessel 25 in the form of a thin film and excess paste is scraped off by movement of the blade portion 26. The chip components B are so pressed against the bottom surface of the dipping vessel 25 that the thickness of the applied electrode paste directly defines electrode widths of the chip components B. Even if the portions of the chip components B projecting from the receiving holes $a_1$ of the holding plate A are dispersed in length, such dispersed lengths are adjusted when the projected portions are pressed against the bottom surface of the dipping vessel 25 when coated with the electrode paste. Thus, it is possible to obtain uniform electrode widths.

When the dipping operation is completed, the chucking portion 27 is upwardly moved beyond the conveyors 23 and 24, which in turn are moved to the approaching positions so that the chucking portion 27 places the holding plate A across the conveyors 23 and 24. Then the conveyors 23 and 24 are driven at the same speed, to transfer the holding plate A to the subsequent conveyor 7.

The conveyor 7 carries the holding plate A holding the chip components B to downwardly direct the electrode surfaces, along an arrow shown in FIG. 1 toward a position immediately in front of the drying furnace 8 through the introduction/extraction conveyor 9. A pair of introduction and extraction arms 30 and 31 are provided immediately in front of the drying furnace 8. These arms 30 and 31 are integrally reciprocable along a shaft 32 which is parallel to the conveyor 9, and upwardly swingable about the shaft 32. The arms 30 and 31 are generally located in upwardly swinging positions so as not to interfere with the holding plate A, which is carried by the conveyor 9. When the holding plate A is carried to the position immediately in front of the drying furnace 8, the arms 30 and 31 swing downwardly to positions along the conveyor 9. Thus, the holding plate A is held between the arms 30 and 31. Then the shaft 32 is frontwardly moved so that the holding plate A is pushed by the introduction arm 30 and inserted into an inlet/outlet port 40 of the drying furnace 8. At this time, the conveyor 9 is preferably driven in synchronization with the introduction arm 30, so that no unwanted vibration is applied to the holding plate A.

Figure 5:
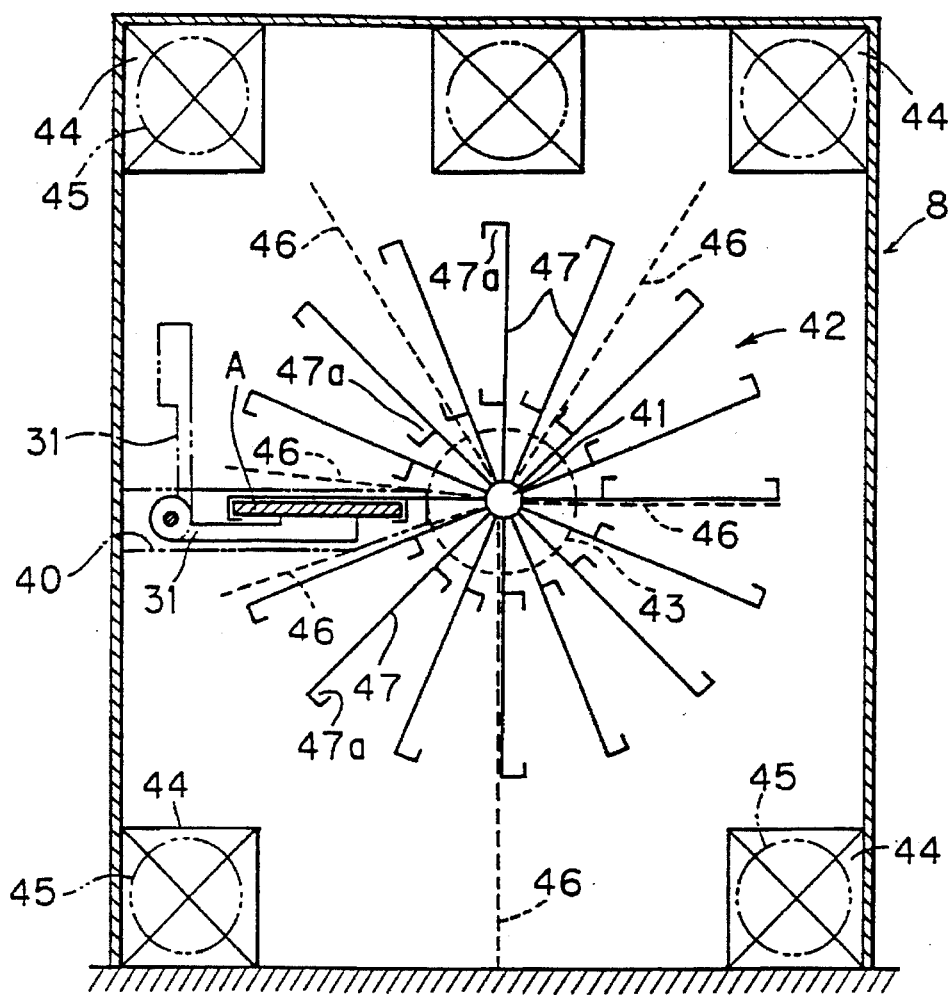
FIG. 5 is an enlarged sectional view taken along the line V—V in FIG. 1.

As shown in FIG. 5, the drying furnace 8 comprises the inlet/outlet port 40 opening perpendicularly to the plane of FIG. 5, a rotor 42 which is rotatable about a horizontal shaft 41, a motor 43 for intermittently rotating the rotor 42 at a constant pitch, a plurality of heaters 44 provided in the interior of the furnace 8, fans 45 for circulating heat generated by the heaters 44 and diaphragms 46 dividing the interior of the furnace 8 into a plurality of heating zones. The rotor 42 has a plurality of radial vanes 47, each of which is provided with a pair of inward insertion grooves 47a. The holding plate A, which is pushed into the inlet/outlet port 40 by the introduction arm 30, is horizontally inserted into the insertion grooves 47a of a vane 47 corresponding to the inlet/outlet port 40. Since the lower surface, exposing the electrode surfaces of the holding plate A thus inserted in the grooves 47a, is opened, the chip components B will not come into contact with the vane 47, and excellent air permeability is attained.

The holding plate A thus held by the vane 47 is rotated by 360° to pass through the five heating zones, whereby the electrode paste applied to the chip components B is dried. When the dried holding plate A reaches the inlet/outlet port 40, the extraction arm 31 is leftwardly moved in FIG. 1, to push the holding plate A onto the introduction/extraction conveyor 9. Then, the arms 30, 31 swing upwardly. The conveyor 9, which is reversibly drivable, is preferably driven leftwardly in FIG. 1 in synchronization with the extraction arm 31. The holding plate A thus placed on the conveyor 9 is reversely transferred toward the dipping machine 6, and stopped at a position under the transfer conveyor 11. The transfer conveyor 11 grasps the holding plate A with a hand 50, and transfers the same to another conveyor 10. The transfer conveyor 11 can be formed by a well-known uniaxial unit, while the hand 50 can be formed by a well-known chucking mechanism for holding both sides of the holding plate A. Also in this case, the holding plate A can be reliably held if the grooves $a_2$ are formed on side surfaces thereof.

After the last one of the dried holding plates A is raised up by the transfer conveyor 11 from the introduction/extraction conveyor 9, subsequent undried holding plates A are transferred from the conveyor 7 to the introduction/extraction conveyor 9, and inserted into the drying furnace 8 by the introduction arm 30. After the dried holding plates A are extracted, rotation of the drying furnace 8 is stopped until the undried holding plates A are introduced.

The holding plates A carried on the conveyor 10 are transferred along an arrow, and successively stored in the unloaders 12. The unloaders 12, which are absolutely similar in structure to the loader 5, stepwisely move up the holding plates A, which are received from the conveyor 10, one by one in a reverse manner to the loader 5. When the holding plates A are all stored in rack frames, the unloaders 12 are automatically stopped.

The drying furnace employable in the present invention is not restricted to the aforementioned one, which is adapted to dry the electrode paste during rotation by 360° and provided with a common inlet/outlet port.

Figure 6:
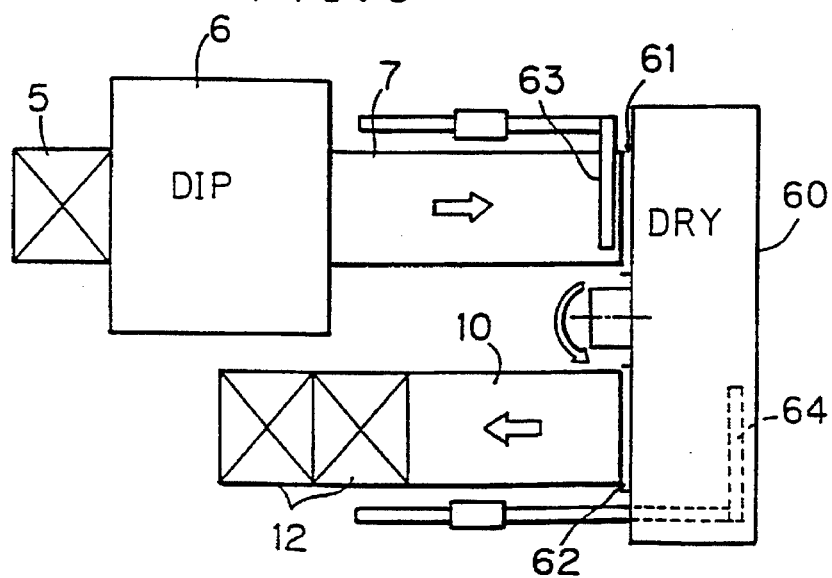
FIG. 6 is a plan view schematically showing an electrode forming apparatus according to another embodiment of the present invention.

FIG. 6 shows an electrode forming apparatus according to another embodiment of the present invention. Referring to FIG. 6, a drying furnace 60 is provided with an inlet 61 and an outlet 62 at positions 180° symmetrical to each other, for drying electrode paste during a rotation of 180°. The inlet 61 and the outlet 62 are provided with an introduction arm 63 and an extraction arm 64 respectively. The internal structure of the drying furnace 60 is similar to that shown in FIG. 5, except for the heaters 44 and the fans 45 provided in the lower portion. Although the lower half of the drying furnace 60 cannot be effectively utilized in this case as compared with the drying furnace 8 shown in FIG. 5, it is possible to easily confirm finished states of electrodes since a holding plate A received in a state having downwardly directing electrode surfaces is extracted from the outlet 62 in an upwardly directed state. Further, the introduction/extraction conveyor 9 and the transfer conveyor 11 can be omitted to simplify the apparatus, while the holding plate A may not be reversely carried nor transferred, to reduce the time therefor.

The inlet/outlet port as well as the inlet and the outlet of the drying furnaces shown in FIGS. 1 and 6 are provided on the front sides so that the conveyors are arranged on the front sides of the drying furnaces in a U-shaped manner, whereby spaces for installing the overall electrode forming apparatuses 4 can be reduced. If space allows, the holding plates A may be inserted from the front sides of the drying furnaces 8 and 60 and extracted from the back sides thereof.

Although embodiments of the present invention have been described and illustrated in detail, it is clearly understood that the same is by way of illustration and example only and is not to be taken by way of limitation, the scope of the present invention being limited only by the terms of the appended claims.

What is claimed is:

1. An electrode forming apparatus for chip components for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with the electrode surfaces of said chip components directed downward and for continuously heating and drying said electrode surfaces of said chip components held by said holding plate, said drying furnace having an inlet through which said holding plate can pass into said furnace and an outlet through which said holding plate can pass out of said furnace; and a conveyor for horizontally transferring said holding plate and said chip components from said dipping machine to said drying furnace, for carrying said holding plate into said drying furnace along a carrying-in path, and for carrying said holding plate out of said drying furnace along a carrying-out path, said carrying-in path and said carrying-out path both being located on a same side of said drying furnace;

said drying furnace comprising a rotor for supporting a plurality of holding plates and being intermittently rotated, a heater for heating and drying said electrode surfaces of said chip components held by said holding plates, and an introduction and extraction device for introducing said holding plates one by one into said rotor, and for extracting said holding plates one by one from said rotor;

wherein said rotor is constructed so as to support and rotate said plurality of holding plates through a 360° rotation.

2. An electrode forming apparatus in accordance with claim 1, wherein said carrying-in and carrying-out paths are substantially parallel to each other.

3. An electrode forming apparatus in accordance with claim 2, wherein said carrying-in and carrying-out paths are substantially the same.

4. An electrode forming apparatus for chip components for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with the electrode surfaces of said chip components directed downward and for continuously heating and drying said electrode surfaces of said chip components held by said holding plate, said drying furnace having an inlet through which said holding plate can pass into said furnace and an outlet through which said holding plate can pass out of said furnace; and a conveyor for horizontally transferring said holding plate and said chip components from said dipping machine to said drying furnace, for carrying said holding plate into said drying furnace along a carrying-in path, and for carrying said holding plate out of said drying furnace along a carrying-out path, said carrying-in path and said carrying-out path both being located on a same side of said drying furnace;

wherein said inlet and said outlet are the same.

5. An electrode forming apparatus in accordance with claim 4, wherein said conveyor comprises a first conveyor and a second, reversibly drivable conveyor disposed between said first conveyor and said inlet and outlet of said drying furnace.

6. An electrode forming apparatus in accordance with claim 5, wherein said conveyor further comprises a third, transfer conveyor for transferring said holding plate away from said reversibly drivable conveyor.

7. An electrode forming apparatus in accordance with claim 5, wherein said carrying-in and carrying-out paths are substantially parallel to each other.

8. An electrode forming apparatus in accordance with claim 7, wherein said carrying-in and carrying-out paths are substantially the same.

9. An electrode forming apparatus in accordance with claim 4, wherein said carrying-in and carrying-out paths are substantially parallel to each other.

10. An electrode forming apparatus for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with said electrode surface of said chip components directed downward and for continuously heating and drying said electrode surfaces, said drying furnace having an inlet through which said holding plate can pass into said furnace and an outlet through which said holding plate can pass out of said furnace;

a conveyor for horizontally transferring said holding plate and said chip components from said dipping machine to said drying furnace, for carrying said holding plate into said drying furnace along a carrying-in path, and for carrying said holding plate out of said drying furnace along a carrying-out path;

a loader for supplying said holding plates one by one to said dipping machine, said loader comprising a pair of rack frames for vertically movably supporting a plurality of said holding plates in a parallel manner, and a loading conveyor horizontally arranged between said loader rack frames;

an unloader for temporarily storing a plurality of said holding plates discharged from said drying surface, said unloader comprising a pair of rack frames for vertically movably supporting a plurality of said holding plates in a parallel manner, and an unloading conveyor horizontally arranged between said unloader rack frames; and an insertion/transfer press, and additional conveyors provided respectively between said insertion/transfer press and said unloader, and between said insertion/transfer press and said loader.

11. An electrode forming apparatus in accordance with claim 10, said drying furnace comprising a rotor for supporting a plurality of holding plates, said rotor being constructed so as to support and rotate said plurality of holding plates through a 360° rotation.

12. An electrode forming apparatus in accordance with claim 10, said drying furnace comprising a rotor for supporting a plurality of holding plates, said rotor being constructed so as to support and rotate said plurality of holding plates through a 180° rotation.

13. An electrode forming apparatus in accordance with claim 10, wherein said carrying-in and carrying-out paths are substantially parallel to each other.

14. An electrode forming apparatus in accordance with claim 13, wherein said carrying-in and carrying-out paths are spaced from each other.

15. An electrode forming apparatus in accordance with claim 13, wherein said carrying-in and carrying-out paths are substantially the same.

16. An electrode forming apparatus for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with said electrode surface of said chip components directed downward and for continuously heating and drying said electrode surfaces, said drying furnace having an inlet through which said holding plate can pass into said furnace and an outlet through which said holding plate can pass out of said furnace;

a conveyor for horizontally transferring said holding plate and said chip components from said dipping machine to said drying furnace, for carrying said holding plate into said drying furnace along a carrying-in path, and for carrying said holding plate out of said drying furnace along a carrying-out path, said carrying-in path and said carrying-out path both being located on a same side of said drying furnace;

a loader for supplying said holding plates one by one to said dipping machine, said loader comprising a pair of rack frames for vertically movably supporting a plurality of said holding plates in a parallel manner, and a loading conveyor horizontally arranged between said loader rack frames; and an unloader for temporarily storing a plurality of said holding plates discharged from said drying surface, said unloader comprising a pair of rack frames for vertically movably supporting a plurality of said holding plates in a parallel manner, and an unloading conveyor horizontally arranged between said unloader rack frames;

wherein said inlet and said outlet are the same, said conveyor comprising a first conveyor and a second, reversibly drivable conveyor disposed between said first conveyor and said inlet and said outlet of said drying furnace.

17. An electrode forming apparatus in accordance with claim 16, wherein said conveyor further comprises a third, transfer conveyor for transferring said holding plate away from said reversibly drivable conveyor.

18. An electrode forming apparatus in accordance with claim 16, said drying furnace comprising a rotor for supporting a plurality of holding plates, said rotor being constructed so as to support and rotate said plurality of holding plates through a 360° rotation.

19. An electrode forming apparatus in accordance with claim 16, said drying furnace comprising a rotor for supporting a plurality of holding plates, said rotor being constructed so as to support and rotate said plurality of holding plates through a 180° rotation.

20. An electrode forming apparatus for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with the electrode surfaces of said chip components directed downward and for continuously heating and drying said electrode surfaces of said chip components held by said holding plate, said drying furnace having an inlet through which said holding plate can pass into said furnace and an outlet through which said holding plate can pass out of said furnace, said inlet and said outlet being provided on a same side of said furnace; and a conveyor for horizontally transferring said holding plate and said chip components from said dipping machine to said drying furnace;

wherein said drying furnace comprises a rotor for supporting a plurality of holding plates and being intermittently rotated, a heater for heating and drying said electrode surfaces of said chip components held by said holding plates, and an introduction and extraction device for introducing said holding plates one by one into said rotor, and for extracting said holding plates one by one from said rotor;

wherein said rotor is constructed so as to support and rotate said plurality of holding plates through a 360° rotation.

21. An electrode forming apparatus for chip components for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with the electrode surfaces of said chip components directed downward and for continuously heating and drying said electrode surfaces of said chip components held by said holding plate, said drying furnace having an inlet through which said holding plate can pass into said furnace and an outlet through which said holding plate can pass out of said furnace; and a conveyor for horizontally transferring said holding plate and said chip components from said dipping machine to said drying furnace, for carrying said holding plate into said drying furnace along a carrying-in path, and for carrying said holding plate out of said drying furnace along a carrying-out path, said carrying-in path and said carrying-out path both being located on a same side of said drying furnace;

wherein said plates transferred along said carrying-in path travel in a direction opposite to that travelled when said plates are transferred along said carrying-out path.

22. An electrode forming apparatus in accordance with claim 21, wherein said carrying-in and carrying-out paths are substantially parallel to each other.

23. An electrode forming apparatus in accordance with claim 22, wherein said carrying-in and carrying-out paths are spaced from each other.

24. An electrode forming apparatus in accordance with claim 22, wherein said carrying-in and carrying-out paths are substantially the same.

25. An electrode forming apparatus in accordance with claim 21, said drying furnace comprising a rotor for supporting a plurality of holding plates, said rotor being constructed so as to support and rotate said plurality of holding plates through a 360° rotation.

26. An electrode forming apparatus in accordance with claim 21, said drying furnace comprising a rotor for supporting a plurality of holding plates, said rotor being constructed so as to support and rotate said plurality of holding plates through a 180° rotation.

27. An electrode forming apparatus for forming external electrodes on projected portions of chip components held by a holding plate, said apparatus comprising:

a dipping machine provided with a dipping vessel having a horizontal bottom surface capable of being coated with a thin film of electrode paste, and a chucking portion arranged above said dipping vessel for horizontally engaging a holding plate which is structured and arranged to hold a plurality of chip components having projected portions downwardly directed toward said dipping vessel and for vertically moving said holding plate downward into said dipping vessel to apply electrode paste, when present on said bottom surface of said dipping vessel, to said downwardly projected portions of said chip components to form electrode surfaces on said projected portions;

a drying furnace for receiving said holding plate with said electrode surface of said chip components directed downward and for continuously heating and drying said electrode surfaces, said drying furnace having an inlet through which said holding plate can pass into said furnace and an outlet through which said holding plate can pass out of said furnace;

a conveyor for horizontally transferring said holding plate and said chip components from said dipping machine to said drying furnace, for carrying said holding plate into said drying furnace along a carrying-in path, and for carrying said holding plate out of said drying furnace along a carrying-out path, said carrying-in path and said carrying-out path both being located on a same side of said drying furnace;

a loader for supplying said holding plates one by one to said dipping machine, said loader comprising a pair of rack frames for vertically movably supporting a plurality of said holding plates in a parallel manner, and a loading conveyor horizontally arranged between said loader rack frames; and an unloader for temporarily storing a plurality of said holding plates discharged from said drying surface, said unloader comprising a pair of rack frames for vertically movably supporting a plurality of said holding plates in a parallel manner, and an unloading conveyor horizontally arranged between said unloader rack frames;

wherein said plates transferred along said carrying-in path travel in a direction opposite to that travelled when said plates are transferred along said carrying-out path.

28. An electrode forming apparatus in accordance with claim 27, wherein said carrying-in and carrying-out paths are substantially parallel to each other.

29. An electrode forming apparatus in accordance with claim 28, wherein said carrying-in and carrying-out paths are spaced from each other.

30. An electrode forming apparatus in accordance with claim 28, wherein said carrying-in and carrying-out paths are substantially the same.

31. An electrode forming apparatus in accordance with claim 27, said drying furnace comprising a rotor for supporting a plurality of holding plates, wherein said rotor is constructed so as to support and rotate said plurality of holding plates through a 180° rotation.

32. An electrode forming apparatus in accordance with claim 27, said drying furnace comprising a rotor for supporting a plurality of holding plates, said rotor being constructed so as to support and rotate said plurality of holding plates through a 360° rotation.

* * * * *